United States Patent
Lauber

(10) Patent No.: US 9,293,298 B2
(45) Date of Patent: Mar. 22, 2016

(54) DEFECT DISCOVERY AND INSPECTION SENSITIVITY OPTIMIZATION USING AUTOMATED CLASSIFICATION OF CORRESPONDING ELECTRON BEAM IMAGES

(71) Applicant: KLA-Tencor Corporation, Milpitas, CA (US)

(72) Inventor: Jan A. Lauber, San Francisco, CA (US)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 14/528,941

(22) Filed: Oct. 30, 2014

(65) Prior Publication Data
US 2015/0179400 A1 Jun. 25, 2015

Related U.S. Application Data

(60) Provisional application No. 61/919,942, filed on Dec. 23, 2013.

(51) Int. Cl.
| | | |
|---|---|---|
| H01J 37/26 | (2006.01) | |
| G01N 23/22 | (2006.01) | |
| G01N 23/00 | (2006.01) | |
| G01N 21/00 | (2006.01) | |

(52) U.S. Cl.
CPC .................................. H01J 37/261 (2013.01)

(58) Field of Classification Search
USPC .............. 250/306, 307, 310, 311, 336.1, 368, 250/395, 473.1, 492.1, 492.2, 492.3, 526, 250/559.39, 559.4, 559.42, 559.43, 559.44
See application file for complete search history.

(56) References Cited

U.S. PATENT DOCUMENTS

| | | | |
|---|---|---|---|
| 6,399,953 B1 * | 6/2002 | Kitamura | H01J 37/28 250/310 |
| 6,423,557 B1 | 7/2002 | Steffan et al. | |
| 6,703,614 B1 * | 3/2004 | Stifter | B82Y 35/00 250/306 |
| 6,782,337 B2 * | 8/2004 | Wack | G01N 21/211 250/559.24 |
| 6,828,571 B1 * | 12/2004 | McCord et al. | 250/492.2 |
| 7,037,735 B2 * | 5/2006 | Noguchi | B82Y 15/00 250/492.1 |
| 7,359,044 B2 * | 4/2008 | Nishiyama et al. | 356/237.4 |
| 8,664,594 B1 * | 3/2014 | Jiang | H01J 37/28 250/306 |
| 8,692,204 B2 * | 4/2014 | Kojima | H01J 37/244 250/336.1 |
| 8,698,093 B1 | 4/2014 | Gubbens et al. | |
| 8,716,662 B1 * | 5/2014 | MacDonald | H01J 37/222 250/307 |
| 2001/0017878 A1 | 8/2001 | Nozoe et al. | |
| 2002/0190207 A1 * | 12/2002 | Levy | G01N 21/211 250/306 |
| 2004/0169852 A1 | 9/2004 | Chen et al. | |
| 2008/0032429 A1 | 2/2008 | Chen et al. | |
| 2008/0165352 A1 | 7/2008 | Takahashi et al. | |
| 2011/0215241 A1 * | 9/2011 | Wang | G01N 23/225 250/307 |

(Continued)

OTHER PUBLICATIONS

International Search Report for PCT/US2014/070807 mailed Mar. 26, 2015.

*Primary Examiner* — Bernard E Souw
(74) *Attorney, Agent, or Firm* — Ann Marie Mewherter

(57) ABSTRACT

Various embodiments for classifying defects detected on a wafer are provided. One method includes acquiring an electron beam image generated by a defect review tool for a location of a defect detected on a wafer by a wafer inspection tool. The method also includes determining a classification of the defect based on at least the electron beam image and without input from a user. The method may also include feeding back the classification results to the wafer inspection tool and optimizing the parameters of the tool to maximize sensitivity to the defects of interest.

35 Claims, 2 Drawing Sheets

(56) References Cited

U.S. PATENT DOCUMENTS

| | | | |
|---|---|---|---|
| 2011/0226949 A1* | 9/2011 | Zeidler | H01J 37/09 250/310 |
| 2013/0105698 A1* | 5/2013 | Freimann | G03F 7/70591 250/362 |
| 2013/0140457 A1* | 6/2013 | Minekawa | G06T 7/0004 250/307 |
| 2014/0193065 A1* | 7/2014 | Chu et al. | 382/149 |
| 2015/0125065 A1* | 5/2015 | Lee | G06T 5/00 382/149 |

* cited by examiner

DEFECT DISCOVERY AND INSPECTION SENSITIVITY OPTIMIZATION USING AUTOMATED CLASSIFICATION OF CORRESPONDING ELECTRON BEAM IMAGES

BACKGROUND OF THE INVENTION

1. Field of the Invention

The present invention generally relates to methods and systems for defect discovery and inspection sensitivity optimization using automated classification of corresponding electron beam images.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Information beyond simple defect detection is often generated during inspection processes. For example, the detected defects are often classified into different groups. In one such example, after finding defects, they may be classified into different groups based on the defect characteristics such as size, magnitude, and location. Defects can also be classified based on the information contained within a patch image, a relatively small subsection of the full image. Sometimes, the context in which a defect was found cannot be determined from a patch image alone, requiring a larger section of the image surrounding the defect.

Defect classification often cannot be performed based on just images or information generated by a wafer inspection tool. In these instances, additional information may be generated using a defect review tool and defect classification is then determined based on the additional information. In some such instances, defects found by an optical defect finding apparatus may be reviewed using a high resolution scanning electron microscope (SEM) review tool. In addition, relatively large numbers of SEM images may be collected. Each of these images may be displayed on a computer screen and a user may use the displayed images to determine if there is a defect present in the image. If a defect is detected by eye, the defect can then be classified by the user into one of several categories depending on its shape, size, location or other attributes.

There are, however, several disadvantages to the presently used defect classification methods performed using images generated by a defect review tool. For example, the manual classification of SEM images is substantially labor intensive and time consuming. In addition, many defects are substantially difficult to observe visually. As such, some subtle defects may be easily overlooked. Accuracy and purity of the classification is also user-dependent.

Accordingly, it would be advantageous to develop methods and systems for classifying defects detected on a wafer that do not have one or more of the disadvantages described above.

SUMMARY OF THE INVENTION

The following description of various embodiments is not to be construed in any way as limiting the subject matter of the appended claims.

One embodiment relates to a computer-implemented method for classifying defects detected on a wafer. The method includes acquiring an electron beam image generated by a defect review tool for a location of a defect detected on a wafer by a wafer inspection tool. The method also includes determining a classification of the defect based on at least the electron beam image and without input from a user. The acquiring and determining steps are performed using a computer system.

Each of the steps of the method described above may be further performed as described herein. In addition, the method described above may include any other step(s) of any other method(s) described herein. Furthermore, the method described above may be performed by any of the systems described herein.

Another embodiment relates to a non-transitory computer-readable medium containing program instructions stored therein for causing a computer system to perform a computer-implemented method for classifying defects detected on a wafer. The computer-implemented method includes the steps of the method described above. The computer-readable medium may be further configured as described herein. The steps of the method may be performed as described further herein. In addition, the method may include any other step(s) of any other method(s) described herein.

An additional embodiment relates to a system configured to classify defects detected on a wafer. The system includes an electron beam defect review subsystem configured to acquire an electron beam image for a location of a defect detected on a wafer by a wafer inspection tool. The system also includes a computer subsystem configured to perform the determining step described above. The system may be further configured according to any embodiment(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
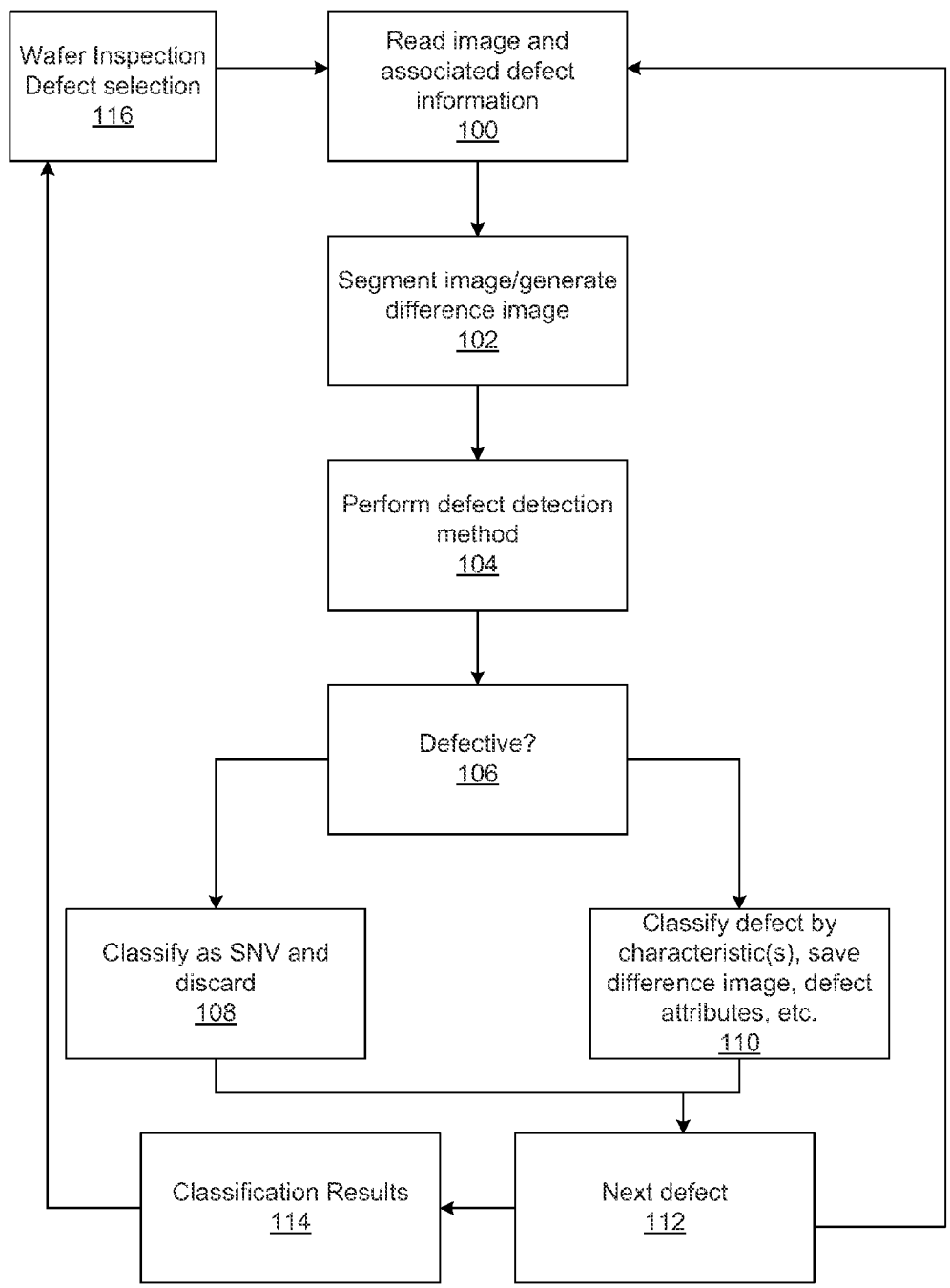
FIG. 1 is a flow chart illustrating one embodiment of a computer-implemented method for classifying detects detected on a wafer.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives filling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a computer-implemented method for classifying defects detected on a wafer. The defects that are classified in the embodiments described herein are defects that are previously detected on the wafer by a wafer inspection tool such as one of those described further herein. In other words, the defects that are classified as described herein are not detected by the embodiments by scanning across an area on the wafer and checking the entire area for any defects that may be present. Instead, the defects are detected by some other method or system, and then the defect locations determined by that other method or system can be used to perform one or more steps described herein. In this manner, the embodiments described herein can be performed post-wafer inspection.

The method includes acquiring an electron beam image generated by a defect review tool for a location of a defect detected on a wafer by a wafer inspection tool. Acquiring the electron beam image may include actually performing an image acquisition process on the wafer (e.g., by imaging the wafer using the electron beam defect review tool). For example, in one embodiment, acquiring the electron beam image includes automatically generating the electron beam image at the location of the defect with the defect review tool based on the location of the defect determined by the wafer inspection tool included in an inspection results file generated by the wafer inspection tool. In this manner, the electron beam images used in the embodiments described herein may be acquired at discrete locations on the wafer based on defect locations reported by inspection. However, acquiring the electron beam image may not include performing a process on the physical wafer. For example, acquiring the electron beam image may include acquiring the electron beam image from a storage medium in which the electron beam image has been stored by another method or the defect review tool. Therefore, although the embodiments described herein may include a defect review tool or be performed using a defect review tool, the embodiments described herein may alternatively be performed without using an electron beam subsystem of a defect review tool. For example, the embodiments may be performed using a graphical user interface (GUI) and an image process tool (a computer subsystem described further herein) that reads in an electron beam image (e.g., a scanning electron microscope (SEM) review image) and outputs a defect classification.

In one embodiment, an inspection process used by the wafer inspection tool to detect the defect is setup to detect defects having sizes that are below a resolution limit of the wafer inspection tool. In another embodiment, the wafer inspection tool is a light-based wafer inspection tool. In an additional embodiment, a sensitivity of the wafer inspection tool used to detect the defect is a highest sensitivity achievable by the wafer inspection tool. In a further embodiment, an inspection process used by the wafer inspection tool to detect the defect is setup to detect unknown defect types on the wafer. For example, the embodiments described herein allow the optical inspection to be run more sensitively, potentially finding new types of defects that were previously undetectable or inseparable from noise. In other words, the embodiments described herein are particularly suitable for defect discovery. For example, typically, an optical wafer inspection tool cannot resolve the smallest of the defects (i.e., defects that are below a resolution capability of the inspection tool). If there are suspected defects of unknown types on a semiconductor wafer, the optical tools may be run in their most sensitive mode. In order to find out if the resulting defects are of interest or are a nuisance type, many of these defects may then be sampled and reviewed (e.g., with a substantially high resolution SEM review tool). The defect classification steps described further herein can be used to quickly sort through these images, selecting the most interesting ones for further human classification. In some cases, new defects may be discovered by this method that were not previously known.

The wafer inspection tool described above may be further configured as described further herein. The wafer inspection tool may be setup to detect defects having sizes below a resolution limit of the tool by selecting one or more parameters of one or more defect detection algorithms such that output images, image data, signals, signal data, etc.) of the wafer inspection tool that is substantially close to the noise floor of the output can be detected as defects. In this manner, although a wafer inspection tool setup in this manner can detect defects having a size below the resolution capability of the wafer inspection tool, the wafer inspection tool may detect a significant amount of nuisance defects (because a significant amount of the output will be close to the noise floor and will be identified as potential defects). "Nuisance" or "nuisance defects" as those terms are used herein generally refers to defects that are detected by a wafer inspection tool that are not actual defects on the wafer or are defects that a user does not care about (i.e., they are not defects of interest (DOIs)). However, since the embodiments described herein can be used to classify and sort through a significant number of defects in a substantially short amount of time, wafer inspection tools can be run in this mode without the normal consequences of such extensive nuisance detection (e.g., inspection results overwhelmed by nuisance, time and cost of sorting out the nuisances, etc.).

In a similar manner, the sensitivity of the wafer inspection tool may be setup to be the highest possible sensitivity. For example, the defect detection algorithm(s) and/or method(s) used by the wafer inspection tool for inspection of the wafer may be set to be the most sensitive possible by adjusting one or more parameters of the algorithm(s) and/or method(s). In one such example, if a defect detection algorithm compares the output of the optics of the inspection tool to a threshold (possibly after some processing is performed on the output), the threshold may be set to the lowest possible value thereby rendering the sensitivity of the tool to be the highest possible.

Setting up a wafer inspection tool as described above will enable discovery of new defect types. For example, by setting up a wafer inspection tool as described above, the wafer inspection tool will likely detect every possible defect on a wafer even though many of those "defects" will likely be nuisances. Therefore, although every possible defect type may be caught by such inspection, the inspection results may need extensive processing, which may even be completely impractical, to separate the actual defects of interest from nuisances. The embodiments described herein, however, can be used to quickly and efficiently sort through the extensive numbers of possible defects detected in such a manner separating nuisances from actual defects. Therefore, the embodiments described herein are particularly suitable for new defect type discovery.

The method also includes determining a classification of the defect based on at least the electron beam image and without input from a user. The embodiments described herein allow automatically scanning through relatively large numbers of electron beam images of defects (e.g., previously collected SEM review images). In addition, the embodiments described herein classify the defects substantially fast and efficiently into different categories. This capability significantly shortens the time to results on the initial optical defect finding apparatus. Determining the classification of the defect may be performed in a number of different manners as described further herein.

In one embodiment, determining the classification includes processing the electron beam image using one or more methods selected based on a design for the wafer, defect types of interest, or a combination thereof. For example, the electron beam image may be processed using any of several methods depending on the pattern type and/or defect type to be kept or rejected. Image processing methods from which the one or more methods are selected may include a variety of image processing techniques such as segmentation of the images, filtering of the images, generating difference images, etc. The embodiments described herein may include selecting the one or more methods used for processing the electron beam image. Information for the design of the wafer and the defect types of interest may be acquired in any suitable manner from any suitable source.

In another embodiment, determining the classification includes determining if the defect is a DOI, a nuisance defect, or a defect that cannot be detected by the defect review tool. For example, the defects may be classified into DOI, nuisance defect, or SEM non-visual (SNV) defects (defects that are not detectable by the electron beam method). Once a defect has been identified as a DOI, a nuisance defect, or a SNV, some defect classification ID (e.g., a defect class code) may be assigned to the defect and stored with other information for the defect. Determining if the defect is a DOI, a nuisance defect, or a SNV may be performed as described further herein.

In some embodiments, the method includes combining results of the method with an inspection results file generated for the wafer by the wafer inspection tool. For example, defects can be sorted by the new defect attributes (the defect classifications determined as described herein and/or any defect attributes or characteristics determined by the embodiments described herein) and the results can be incorporated into the results the of the initial optical inspection.

In a further embodiment, the method includes altering an inspection results file generated for the wafer by the wafer inspection tool based on the determined classification. For example, any of the defects determined to be nuisance defects by the embodiments described herein may be removed from the inspection results file. Therefore, the embodiments described herein may be configured for automatic nuisance defect removal using SEM review images.

In one embodiment, determining the classification includes performing a defect detection method on the electron beam image. For example, one of several detection methods may be used to classify a SEM review image into one of the different categories described herein. The embodiments described herein are flexible in that new detection algorithms can easily be added to the embodiments if a new defect type is encountered. Therefore, although, as described above, the embodiments are performed post-inspection, the embodiments described herein may include defect detection performed selectively at discrete locations on the wafer determined from the wafer inspection results file. In other words, determining the classification as described herein may include redetection of a previously detected defect. The defect detection method performed on the electron beam image may include any suitable defect detection method.

One such embodiment is shown in FIG. 1, which includes step 100 in which an image and associated defect information is read into the method. The image that is read into the method may be the electron beam image generated by the defect review tool. The associated defect information may be the defect information included in the inspection results file possibly with any defect information determined from the electron beam image.

The method also includes segmenting the image and/or generating a difference image as shown in step 102. Segmenting the image may be performed based on one or more characteristics of the image such as features on the wafer that are resolved in the image, portions of the image that correspond to a care area, portions of the image that correspond to a defect location determined by the wafer inspection toot, and the like. Generating a difference image may include subtracting a reference image from the electron beam image. The reference image may include a different electron beam image generated at a different location on the wafer in which the same portion of the design was printed, a reference image stored in a database that may have been generated from the design, or any other suitable reference image. In addition, the method includes performing defect detection, as shown in step 104. The defect detection may be performed on the segmented image and/or the difference image. Performing the defect detection may include applying any one or more defect detection methods and/or algorithms to the segmented image, the difference image, and/or the electron beam image, and those method(s) and/or algorithm(s) may be selected as described above.

The method further includes determining if the location at which the electron beam image was generated is defective as shown in step 106. This step may include examining the results of the defect detection method performed in step 104 to determine if a defect has been detected at the previously reported defect location. If it is determined that the defect location is not defective, the method may include step 108 in which the defect is classified as a SNV and discarded.

In another embodiment, determining the classification includes determining one or more attributes of the defect based on the electron beam image. The characteristic(s) determined for the defect may include any of the characteristic(s) or attribute(s) described herein such as magnitude, size, shape, or location. The defect characteristic(s) and/or attribute(s) may be determined by processing the electron beam image or any other images described herein using any suitable method and/or algorithm. If it is determined that the defect location is defective, the method includes step 110 in which the defect is classified by any characteristic(s) determined for the defect. The method may also include determining the next defect to be classified as shown in step 112 of FIG. 1. The steps shown in FIG. 1 may then be performed for the next defect and may be repeated until all defects selected for defect review have been classified.

In this manner, although the embodiments may be described herein with respect to "a defect," it is to be understood that the embodiments described herein may be performed to classify one, some, only a portion of, or all of the defects detected on a wafer. For example, in some instances, only a portion of the defects detected on a wafer by inspection may be selected for the defect classification described herein. Such selection is often referred to as "sampling." However, once a defect classification has been determined for a defect or multiple defects, the determined defect classification may be assigned to other similar defects (e.g., defects located in the same portion of a design for a wafer and/or having substantially the same defect characteristics and/or attribute(s)).

Therefore, although the embodiments described herein may not be performed for all defects detected on a wafer, the results of the embodiments described herein may be applied to the wafer inspection results to thereby classify and/or sort through all of the detected defects.

The embodiments described herein may also include saving any information generated for the defect such as a difference image, defect attributes, defect classification, etc. For example, as shown in FIG. 1, the method may include generating classification results, as shown in step 114. In addition to storing information such as that described above, generating the classification results may include, for example, compiling the classification results by calculating the ratio of DOI to SNV defects. The classification results may be generated in any suitable formed and may be stored in any suitable storage medium.

The classification results may then be used in any other step(s) described herein. For example, as shown in FIG. 1, the method may include performing wafer inspection defect selection, as shown in step 116. In this manner, the embodiment shown in FIG. 1 illustrates an over-arching cycle that may be performed by the embodiments described herein and may include wafer inspection (as may have been performed to generate the information read into the method in step 100), the classification loop over all the defects, a summary of classification (e.g., the classification results after all of the defects to be classified have been classified), and feedback to the wafer inspection to close the loop (as in the wafer inspection defect selection step 116). As such, the embodiments may include compilation of the classification results and a feedback loop to a wafer inspection tool. As a result of such feedback, the wafer inspection tool may be tuned, which may be performed as described further herein.

In an additional embodiment, determining the classification includes correlating the electron beam image of the defect with an optical image of the defect generated by the wafer inspection tool. In this manner, the embodiments described herein can automatically correlate the SEM images with the optical images which further improves the classification accuracy of the defects. In addition, if a defect is seen in both the optical and electron beam images, they can be associated with each other unambiguously if their locations match. However, if the defect is only seen in the optical image and not the electron beam image, then the defect most likely occurred in a previous layer (a buried defect), visible to optical tools only. Therefore, by correlating the two images for a defect, information about the defect can be determined and used for classification. The image correlation may be performed using any suitable algorithm and/or method.

In one such embodiment, the correlating step includes scaling one or more of the electron beam image and the optical image to a common resolution. For example, by scaling one or more of the images for a defect to a common resolution and correlating them, the optical image and the electron beam image can be compared directly to each other. Scaling the image(s) to a common resolution may be performed using any suitable algorithm and/or method.

In another embodiment, the correlating step includes aligning the electron beam image to the optical image based on one or more patterned features in the electron beam and optical images having a unique geometry within the electron beam and optical images. For example, scaling one or more of the images for a defect to a common resolution and correlating them allows the images to be aligned to each other using any unique pattern(s) in the image.

In a further embodiment, determining the classification includes determining a location of the defect in the optical image based on results of correlating the electron beam image with the optical image. For example, correlating and aligning the images as described above allows measurement of the defect location with the highest accuracy (e.g., of a few nanometers). In addition, even if the defect is only visible in an electron beam image and not an optical image, the position of the defect can be marked in the optical image with a substantially high degree of accuracy.

In an additional embodiment, the method includes altering one or more parameters of a wafer inspection process used to detect the defect based on the determined classification. The parameter(s) of the wafer inspection process may be altered based on the classification determined according to any of the embodiments described herein correlating the electron beam image with the optical image). For example, if the defect is only visible in an electron beam image and not an optical image, the position of the defect can be marked in the optical image with a substantially high degree of accuracy, and the wafer inspection tool can then be tuned to make the defect detectable with the optical tool. Tuning the wafer inspection tool may include tuning (altering) one or more optical parameters of the wafer inspection tool and/or one or more defect detection (output processing) parameters of the wafer inspection tool.

In some embodiments, the method includes displaying, to the user, the determined classification, one or more images for the defect, and any attributes of the defect determined by the method. For example, the defect image along with any other images described herein (e.g., difference images) may be displayed to a user along with any relevant measured attribute(s). The defect classification and the attributes can then be saved for further use.

The embodiments described herein have, therefore, several advantages over other methods and systems for classifying defects detected on a wafer. For example, the embodiments described herein are much faster and more accurate than the human classification. The embodiments described herein can, therefore, be used to save a substantial amount of time over manual classification of defects. In addition, the results are more repeatable and not user-dependent. As such, the embodiments described herein can be advantageously used to detect and classify defects that are difficult to detect and classify by eye in a consistent and repeatable way. One example of such defects is substantially subtle void-type defects. Since more defects can be classified in a relatively short amount of time, the embodiments described herein can be an integral part of the defect detection process thereby allowing the user to run substantially sensitive inspections and subsequently filter out the nuisance defects with the embodiments described herein.

Acquiring the electron beam image and determining the classification are performed using a computer system, which may be configured as described further herein.

Each of the embodiments of the method described above may include any other step(s) of any other method(s) described herein. Furthermore, each of the embodiments of the method described above may be performed by any of the systems described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 2:
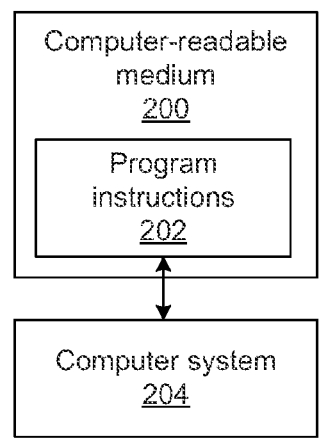
FIG. 2 is a Hock diagram illustrating one embodiment of a non-transitory computer-readable medium that includes program instructions executable on a computer system for performing one or more of the computer-implemented methods described herein.

An additional embodiment relates to a non-transitory computer-readable medium storing program instructions executable on a computer system for performing a computer-implemented method for classifying defects detected on a wafer. One such embodiment is shown in FIG. 2, in particular, as shown in FIG. 2, computer-readable medium 200 includes program instructions 202 executable on computer system 204. The computer-implemented method includes the steps of the method described above. The computer-implemented method for which the program instructions are executable may include any other step(s) described herein.

Program instructions 202 implementing methods such as those described herein may be stored on computer-readable medium 200. The computer-readable medium may be a storage medium such as a magnetic or optical disk, or a magnetic tape or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system may also include any suitable processor known in the art such as a parallel processor. In addition, the computer system may include a computer platform with high speed processing and software, either as a standalone or a networked tool.

Figure 3:
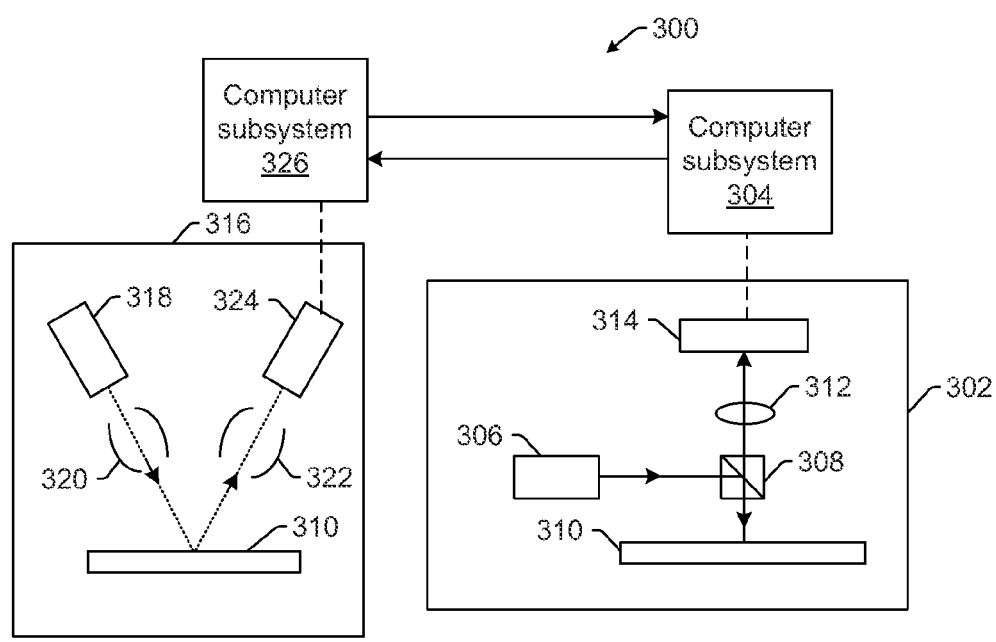
FIG. 3 is a schematic diagram illustrating a side view of one embodiment system configured to classify defects detected on a wafer.

An additional embodiment relates to a system configured to classify defects detected on a wafer. One embodiment of such a system is shown in FIG. 3. System 300 may include inspection subsystem 302 configured to generate output for a wafer, which is configured in this embodiment as described further herein. The system may also include computer subsystem 304 configured for performing one or more steps using the generated output such as defect detection. The inspection subsystem and computer subsystem 304 in combination may form at least part of a wafer inspection tool, which may be configured and used as described further herein.

The inspection subsystem may be configured to generate the output for the wafer by scanning the wafer with light and detecting light from the wafer during the scanning. For example, as shown in FIG. 3, the inspection subsystem includes light source 306, which may include any suitable light source known in the art. Light from the light source may be directed to beam splitter 308, which may be configured to direct the light from the light source to wafer 310. The light source may be coupled to any other suitable elements (not shown) such as one or more condensing lenses, collimating lenses, relay lenses, objective lenses, apertures, spectral filters, polarizing components and the like. As shown in FIG. 3, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The inspection subsystem may be configured to scan the light over the wafer in any suitable manner.

Light from wafer 310 may be collected and detected by one or more channels of the inspection subsystem during scanning. For example, light reflected from wafer 310 at angles relatively close to normal (i.e., specularly reflected light when the incidence is normal) may pass through beam splitter 308 to lens 312. Lens 312 may include a refractive optical element as shown in FIG. 3. In addition, lens 312 may include one or more refractive optical elements and/or one or more reflective optical elements. Light collected by lens 312 may be focused to detector 314. Detector 314 may include any suitable detector known in the art such as a charge coupled device (CCD) or another type of imaging detector. Detector 314 is configured to generate output that is responsive to the reflected light collected by lens 312. Therefore, lens 312 and detector 314 form one channel of the inspection subsystem. This channel of the inspection subsystem may include any other suitable optical components (not shown) known in the art.

Since the inspection subsystem shown in FIG. 3 is configured to detect light specularly reflected from the wafer, the inspection subsystem is configured as a bright field (BF) inspection subsystem. Such an inspection subsystem may, however, also be configured for other types of wafer inspection. For example, the inspection subsystem shown in FIG. 3 may also include one or more other channels (not shown). The other channel(s) may include any of the optical components described herein such as a lens and a detector, configured as a scattered light channel. The lens and the detector may be further configured as described herein. In this manner, the inspection subsystem may also be configured for dark field (DF) inspection.

Computer subsystem 304 is coupled to the inspection subsystem such that output generated by the detector(s) during scanning may be provided to computer subsystem 304. For example, the computer subsystem may be coupled to detector 314 (e.g., by one or more transmission media shown by the dashed line in FIG. 3, which may include any suitable transmission media known in the art) such that the computer subsystem may receive the output generated by the detector. The computer subsystem may be configured to perform any step(s) using the output generated by the detector such as defect detection and generating an inspection results file for the wafer.

The system shown in FIG. 3 also includes an electron beam defect review subsystem configured to acquire an electron beam image for a location of a defect detected on a wafer by a wafer inspection tool as described further herein. The electron beam defect review subsystem shown in FIG. 3 includes electron column 316 coupled to computer subsystem 326.

As also shown in FIG. 3, computer subsystem 304 coupled to the inspection subsystem and computer subsystem 326 coupled to the electron beam defect review subsystem may be coupled by a transmission medium (as shown by the solid lines between the computer subsystems). Therefore, the defect review system may be coupled to the inspection system via their computer subsystems. The computer subsystems of the inspection and defect review systems may be coupled to send information between the two computer subsystems. In addition, the systems and/or the computer subsystems may be configured for automated two-way communication between the inspection tool and the review tool. Two-way communications between the computer subsystems of the wafer inspection and review tools provides capability for automated feedback of the classification results to inspection (e.g., in the feedback loop described herein).

The electron column includes electron beam source 318 configured to generate electrons that are focused to wafer 310 by one or more elements 320. The electron beam source may include, for example, a cathode source or emitter tip, and one or more elements 320 may include, for example, a gun lens, an anode, a beam limiting aperture, a gate valve, a beam current selection aperture, an objective lens, and a scanning subsystem, all of which may include any such suitable elements known in the art. Electrons returned from the wafer (e.g., secondary electrons) may be focused by one or more elements 322 to detector 324. One or more elements 322 may include, for example, a scanning subsystem, which may be the same scanning subsystem included element(s) 320. The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein. Although the electron column is shown in FIG. 3 as being configured such that the electrons are directed to the wafer at an oblique angle of incidence and are scattered from the wafer at another oblique angle, it is to be understood that the electron beam may be directed to and scattered from the wafer at any suitable angles.

Computer subsystem 326 may be coupled to detector 324 as described above. The detector may detect electrons returned from the surface of the wafer thereby forming electron beam images of the wafer. The electron beam images may include any of the electron beam images described herein. Computer subsystem 326 is configured to determine a classification of the defect based on at least the electron beam image and without input from a user, which may be performed according to any of the embodiments described further herein. Computer subsystem 326 may be configured to perform any additional step(s) described herein.

It is noted that FIG. 3 is provided herein to generally illustrate a configuration of an inspection system and defect review system that may be included in the system embodiments described herein. Obviously, the inspection and defect review system configurations described herein may be altered to optimize the performance of the inspection system and defect review system as is normally performed when designing commercial inspection and defect review systems. In addition, the systems described herein may be implemented using an existing inspection system and/or existing defect review system (e.g., by adding functionality described herein to an existing inspection or defect review system) such as the 29xx, 9xxx series of tools and eDR series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Further modifications and alternative embodiments of various aspects of the invention will be apparent to those skilled in the art in view of this description. For example, methods and systems for classifying defects detected on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for classifying defects detected on a wafer, comprising:
    acquiring an electron beam image generated by a defect review tool for a location of a defect detected on a wafer by a wafer inspection tool, wherein an inspection process used by the wafer inspection tool to detect the defect is setup to detect defects having sizes that are below a resolution limit of the wafer inspection tool; and
    determining a classification of the defect based on at least the electron beam image and without input from a user, wherein said acquiring and said determining are performed using a computer system.

2. The method of claim 1, wherein the wafer inspection tool is a light-based wafer inspection tool.

3. The method of claim 1, wherein a sensitivity of the wafer inspection tool used to detect the defect is a highest sensitivity achievable by the wafer inspection tool.

4. The method of claim 1, wherein the inspection process used by the wafer inspection tool to detect the defect is further setup to detect unknown defect types on the wafer.

5. The method of claim 1, wherein acquiring the electron beam image comprises automatically generating the electron beam image at the location of the defect with the defect review tool based on the location of the defect determined by the wafer inspection tool included in an inspection results file generated by the wafer inspection tool.

6. The method of claim 1, wherein determining the classification comprises performing a defect detection method on the electron beam image.

7. The method of claim 1, wherein determining the classification comprises determining one or more attributes of the defect based on the electron beam image.

8. The method of claim 1, wherein determining the classification comprises correlating the electron beam image of the defect with an optical image of the defect generated by the wafer inspection tool.

9. The method of claim 8, wherein said correlating comprises scaling one or more of the electron beam image and the optical image to a common resolution.

10. The method of claim 8, wherein said correlating comprises aligning the electron beam image to the optical image based on one or more patterned features in the electron beam and optical images having a unique geometry within the electron beam and optical images.

11. The method of claim 8, wherein determining the classification further comprises determining a location of the defect in the optical image based on results of correlating the electron beam image with the optical image.

12. The method of claim 1, further comprising displaying, to the user, the determined classification, one or more images for the defect, and any attributes of the defect determined by the method.

13. The method of claim 1, wherein determining the classification comprises processing the electron beam image using one or more methods selected based on a design for the wafer, defect types of interest, or a combination thereof.

14. The method of claim 1, wherein determining the classification comprises determining if the defect is a defect of interest, a nuisance defect, or a defect that cannot be detected by the defect review tool.

15. The method of claim 1, further comprising altering one or more parameters of the inspection process used to detect the defect based on the determined classification.

16. The method of claim 1, further comprising combining results of the method with an inspection results file generated for the wafer by the wafer inspection tool.

17. The method of claim 1, further comprising altering an inspection results file generated for the wafer by the wafer inspection tool based on the determined classification.

18. A non-transitory computer-readable medium containing program instructions stored therein for causing a computer system to perform a computer-implemented method for classifying defects detected on a wafer, wherein the computer-implemented method comprises:
acquiring an electron beam image generated by a defect review tool for a location of a defect detected on a wafer by a wafer inspection tool, wherein an inspection process used by the wafer inspection tool to detect the defect is setup to detect defects having sizes that are below a resolution limit of the wafer inspection tool; and
determining a classification of the defect based on at least the electron beam image and without input from a user.

19. A system configured to classify defects detected on a wafer, comprising:
an electron beam defect review subsystem configured to acquire an electron beam image for a location of a defect detected on a wafer by a wafer inspection tool, wherein an inspection process used by the wafer inspection tool to detect the defect is setup to detect defects having sizes that are below a resolution limit of the wafer inspection tool; and
a computer subsystem configured to determine a classification of the defect based on at least the electron beam image and without input from a user.

20. The system of claim 19, wherein the wafer inspection tool is a light-based wafer inspection tool.

21. The system of claim 19, wherein a sensitivity of the wafer inspection tool used to detect the defect is a highest sensitivity achievable by the wafer inspection tool.

22. The system of claim 19, wherein the inspection process used by the wafer inspection tool to detect the defect is further setup to detect unknown defect types on the wafer.

23. The system of claim 19, wherein the electron beam defect review subsystem is further configured to acquire the electron beam image by automatically generating the electron beam image at the location of the defect based on the location of the defect determined by the wafer inspection tool included in an inspection results file generated by the wafer inspection tool.

24. The system of claim 19, wherein the computer subsystem is further configured to determine the classification of the defect by performing a defect detection method on the electron beam image.

25. The system of claim 19, wherein the computer subsystem is further configured to determine the classification of the defect by determining one or more attributes of the defect based on the electron beam image.

26. The system of claim 19, wherein the computer subsystem is further configured to determine the classification of the defect by correlating the electron beam image of the defect with an optical image of the defect generated by the wafer inspection tool.

27. The system of claim 26, wherein said correlating comprises scaling one or more of the electron beam image and the optical image to a common resolution.

28. The system of claim 26, wherein said correlating comprises aligning the electron beam image to the optical image based on one or more patterned features in the electron beam and optical images having a unique geometry within the electron beam and optical images.

29. The system of claim 26, wherein the computer subsystem is further configured to determine the classification of the defect by determining a location of the defect in the optical image based on results of correlating the electron beam image with the optical image.

30. The system of claim 19, wherein the computer subsystem is further configured for displaying, to the user, the determined classification, one or more images for the defect, and any attributes of the defect determined by the computer subsystem.

31. The system of claim 19, wherein the computer subsystem is further configured to determine the classification of the defect by processing the electron beam image using one or more methods selected based on a design for the wafer, defect types of interest, or a combination thereof.

32. The system of claim 19, wherein the computer subsystem is further configured to determine the classification of the defect by determining if the defect is a defect of interest, a nuisance defect, or a defect that cannot be detected by the defect review tool.

33. The system of claim 19, wherein the computer subsystem is further configured to alter one or more parameters of the inspection process used to detect the defect based on the determined classification.

34. The system of claim 19, wherein the computer subsystem is further configured to combine results generated by the computer subsystem with an inspection results file generated for the wafer by the wafer inspection tool.

35. The system of claim 19, wherein the computer subsystem is further configured to alter an inspection results file generated for the wafer by the wafer inspection tool based on the determined classification.

* * * * *